(12) United States Patent
Ichikawa

(10) Patent No.: US 9,722,598 B2
(45) Date of Patent: Aug. 1, 2017

(54) SEMICONDUCTOR DEVICE

(71) Applicant: FUJI ELECTRIC CO., LTD., Kawasaki (JP)

(72) Inventor: Hiroaki Ichikawa, Azumino (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 14/806,290

(22) Filed: Jul. 22, 2015

(65) Prior Publication Data
US 2016/0072499 A1 Mar. 10, 2016

(30) Foreign Application Priority Data

Sep. 9, 2014 (JP) ................................. 2014-183091

(51) Int. Cl.
*H03K 17/567* (2006.01)
*H02M 1/088* (2006.01)
*H02M 7/487* (2007.01)
*H02M 7/497* (2007.01)

(52) U.S. Cl.
CPC .......... *H03K 17/567* (2013.01); *H02M 1/088* (2013.01); *H02M 7/487* (2013.01); *H02M 7/497* (2013.01); *H01L 2224/48091* (2013.01)

(58) Field of Classification Search
CPC .............................. H03K 17/00; H03K 17/567
See application file for complete search history.

(56) References Cited

U.S. PATENT DOCUMENTS

| 6,101,114 | A | 8/2000 | Kijima et al. | |
| 8,183,909 | B2* | 5/2012 | Schreiber | H02M 7/219 327/434 |
| 8,604,841 | B2* | 12/2013 | Lobsiger | H02M 1/088 327/108 |
| 8,811,048 | B2* | 8/2014 | Zhang | H02P 27/14 363/37 |

FOREIGN PATENT DOCUMENTS

| JP | 2000-060140 | 2/2000 |
| JP | 2006-158107 | 6/2006 |

* cited by examiner

*Primary Examiner* — Hai L Nguyen

(57) ABSTRACT

A semiconductor device, according to one possible configuration, includes switching circuits, each switching circuit comprising IGBT chips connected in series and clamping diodes. The semiconductor device also includes a first and a second wiring line and auxiliary emitter lines. The first wiring line and a first auxiliary emitter line connect the emitter terminals of IGBT chips of the first and second switching circuits. The second wiring line and another auxiliary emitter line connect the emitter terminals of the third IGBT chips of the first and second switching circuits. The wiring lines have a large current carrying capacity and a lower resistance value than their respectively connected auxiliary emitter line.

17 Claims, 9 Drawing Sheets

US 9,722,598 B2

SEMICONDUCTOR DEVICE

CROSS-REFERENCE TO RELATED APPLICATIONS

This application is based on, and claims priority to, Japanese Patent Application No. 2014-183091, filed on Sep. 9, 2014, the content of which is incorporated herein by reference.

BACKGROUND

1. Field

The present disclosure relates to a semiconductor device, in particular to a semiconductor device that is a power conversion module accommodating a plurality of switching elements connected in series in a package and connecting plural sets of the plurality of series-connected switching elements in parallel to increase current carrying capacity of the semiconductor device.

2. Description of Related Art

Semiconductor devices for power conversion often use insulated gate bipolar transistors (IGBTs), which are power switching elements exhibiting excellent operation performances in high voltage, heavy current and high speed switching. A semiconductor device having a multilevel inverter circuit is known to meet the requirements for down-sizing and high performance. The multilevel inverter circuit outputs multi-levels of voltages in combination of plurality of IGBTs, and is disclosed in Japanese Unexamined Patent Application Publication No. 2000-060140, for example.

FIG. 7 is a circuit diagram of a one phase, three-level inverter circuit of a general construction using switching elements of IGBTs. FIG. 8 is a circuit diagram of a first example of a three-level inverter circuit with increased current carrying capacity, and FIG. 9 is a circuit diagram of a second example of a three-level inverter circuit with increased current carrying capacity.

The three-level inverter circuit of FIG. 7 comprises: four IGBTs 101, 102, 103, and 104; four free-wheeling diodes 105, 106, 107, and 108; and two clamping diodes 109 and 110. The IGBTs 101, 102, 103, and 104 having respective antiparallel-connected free-wheeling diodes 105, 106, 107, and 108 are each composed of a discrete module.

The IGBTs 101, 102, 103, and 104 are connected in series and the middle node is connected to an output terminal 111. A node between the IGBT 101 and the IGBT 102 composing an upper arm of the inverter circuit is connected to a clamping diode 109. A node between the IGBT 103 and the IGBT 104 composing a lower arm of the inverter circuit is connected to a clamping diode 110. The clamping diodes 109 and 110 also compose a module.

The emitter terminal of the IGBT 104 is connected to the negative terminal potential N of a power supply. The collector terminal of the IGBT 101 is connected to the positive terminal potential P of the power supply. The node between the clamping diodes 109 and 110 is connected to the middle potential M of the power supply.

A voltage having three-levels of potential in each of the positive and negative sides is delivered from the output terminal 111 by ON/OFF-controlling the IGBTs 101, 102, 103, and 104. Each of the IGBTs 101, 102, 103, and 104 is a module having a current carrying capacity corresponding to the rated output of the inverter circuit.

When each of single IGBT 101, 102, 103, and 104 cannot supply enough current carrying capacity, a plurality of IGBTs are connected in parallel. In the example of FIG. 8, the upper arm of the inverter circuit is composed of two sets of series-connected modules, one set being composed of a module of an IGBT 101a and a module of an IGBT 101b connected in parallel, and another set being composed of a module of an IGBT 102a and a module of an IGBT 102b connected in parallel. The lower arm of the inverter circuit is composed of two sets of series-connected modules, one set being composed of a module of an IGBT 103a and a module of an IGBT 103b connected in parallel, and another set being composed of a module of an IGBT 104a and a module of an IGBT 104b connected in parallel.

In the construction of the inverter circuit, the modules are prepared separately and then assembled together, leading to complicated wiring. In addition, drive circuits have to be prepared individually.

FIG. 9 shows another example of an inverter circuit. This inverter circuit is not composed of a combination of a plurality of modules but is formed of a single module that is composed of a plurality of chips combined together. The inverter circuit of FIG. 9 is composed of two sets of circuits, each set being composed of series-connected chips and being similar to the inverter circuit of FIG. 7.

The upper arm of the inverter circuit comprises series-connected IGBT chips 121 and 122 and series-connected IGBT chips 131 and 132 that are connected in parallel to the series-connected IGBT chips 121 and 122. The lower arm of the inverter circuit comprises series-connected IGBT chips 123 and 124 and series-connected IGBT chips 133 and 134 that are connected in parallel to the series-connected IGBT chips 123 and 124. In the parallel connected circuit in the upper arm, the corresponding IGBT chips 121 and 131 have a common gate terminal 141 and a common auxiliary emitter terminal 151; and the corresponding IGBT chips 122 and 132 have a common gate terminal 142 and a common auxiliary emitter terminal 152. Likewise, in the parallel connected circuits in the lower arm, the corresponding IGBT chips 123 and 133 have a common gate terminal 143 and a common auxiliary emitter terminal 153; and the corresponding IGBT chips 124 and 134 have a common gate terminal 144 and a common auxiliary emitter terminal 154.

The auxiliary emitter terminal 151 is connected to the emitter of the IGBT chip 121 and further to the emitter of the IGBT chip 131 through an auxiliary emitter line 161. The auxiliary emitter terminal 152 is connected to the emitter of the IGBT chip 122 and further to the emitter of the IGBT chip 132 through an auxiliary emitter line 162. Likewise, the auxiliary emitter terminal 153 is connected to the emitter of the IGBT chip 123 and further to the emitter of the IGBT chip 133 through an auxiliary emitter line 163. The auxiliary emitter terminal 154 is connected to the emitter of the IGBT chip 124 and further to the emitter of the IGBT chip 134 through an auxiliary emitter line 164.

The node between the IGBT chips 122 and 123 is connected to the node between the IGBT chips 132 and 133 through an output line 171, and the node between the IGBT chips 132 and 133 is connected to an output terminal 111 through an output line 172.

The clamping diode 125 is connected to the node between the IGBT chips 121 and 122, and the clamping diode 126 is connected to the node between the IGBT chips 123 and 124. The clamping diode 135 is connected to the node between the IGBT chips 131 and 132, and the clamping dode 136 is connected to the node between the IGBT chips 133 and 134. A voltage with three-levels of potential in each of positive and negative sides is delivered from the output terminal 111 by ON/OFF-controlling the IGBT chips 121 and 131, the IGBT chips 122 and 132, the IGBT chips 123 and 133, and the IGBT chips 124 and 134.

In the construction of parallel-connection of series-connected circuits, imbalance of operation of corresponding IGBT chips generates a potential difference between both ends of the auxiliary emitter line, which may destroy the auxiliary emitter line by abnormal current. For example, the four IGBT chips 121, 122, 131, and 132 of the upper ram in FIG. 9 have not necessarily equivalent characteristics, but for example ON resistances are different in the ON operation. Suppose that the IGBT chips 121 and 132 exhibit relatively low ON resistance and the IGBT chips 122 and 131 exhibit relatively high ON resistance. Then, the IGBT chip 121 with lower ON resistance tends to carry larger current than the IGBT chip 131 with higher ON resistance; and the IGBT chip 132 with lower ON resistance tends to carry larger current than the IGBT chip 122 with higher ON resistance. As a result, the current supplied from the positive potential terminal P flows in larger amount through the path of IGBT chip 121, the auxiliary emitter line 161, and the IGBT chip 132 to the output terminal 111. The current flowing in the auxiliary emitter line 161 generates potential difference between both ends of the auxiliary emitter line. As a consequence, although the same gate voltage is applied between the gate terminal 141 and the auxiliary emitter terminal 151, the voltage between the gate and emitter of the IGBT chip 121 differs from the voltage between the gate and emitter of the IGBT chip 131. Thus, the IGBT chips 121 and 131 perform different operations. In addition, the auxiliary emitter line 161 with a small current carrying capacity may burn out with a heavy current.

SUMMARY

Embodiments of the present invention have been made in view of the problem in conventional technologies, and an aspect of the present invention is to provide a semiconductor device that avoids development of potential difference in the auxiliary emitter line that is a wiring line in the base potential side of the IGBT chips connected in parallel, even though imbalance in characteristics among the IGBT chips exists.

To solve the above problem, a semiconductor device of embodiments of the present invention comprises: at least two switching circuits connected in parallel, the switching circuit comprising at least two switching elements connected in series and a clamping diode connected to a node between adjacent switching elements; a base potential line connecting auxiliary terminals at a base potential for applying an equivalent control signal on the switching elements that operate to deliver an equal level of potential in the parallel-connected switching circuits. The semiconductor device comprises a wiring line that connects the corresponding nodes of the parallel-connected switching circuits and that has a current carrying capacity approximately equal to a rated current of the semiconductor element and a lower resistance value than the base potential line.

The semiconductor device as stated above comprises a wiring line with a large current carrying capacity and a low resistance provided in parallel to the base potential line. As a consequence, even when imbalance in characteristics exists among the switching elements constructing the switching circuits connected in parallel, heavy current does not flow through the base potential line. Therefore, potential difference does not develop in the base potential line.

The semiconductor device having the construction described above prevents current imbalance in switching operation by providing a wiring line with a high current carrying capacity and low a resistance in parallel to the base potential line between the parallel-connected switching circuits. Therefore, switching loss in the semiconductor device is minimized.

BRIEF DESCRIPTION OF THE DRAWINGS

These and/or other aspects and advantages will become apparent and more readily appreciated from the following description of the embodiments, taken in conjunction with the accompanying drawings of which.

DESCRIPTION OF EMBODIMENTS

The following describes embodiments in applications to modules of multi-level inverter circuit using switching elements of IGBTs, with reference to accompanying drawings. These embodiments can be actually applied in combination of the embodiments as long as no contradiction arises.

Figure 1:
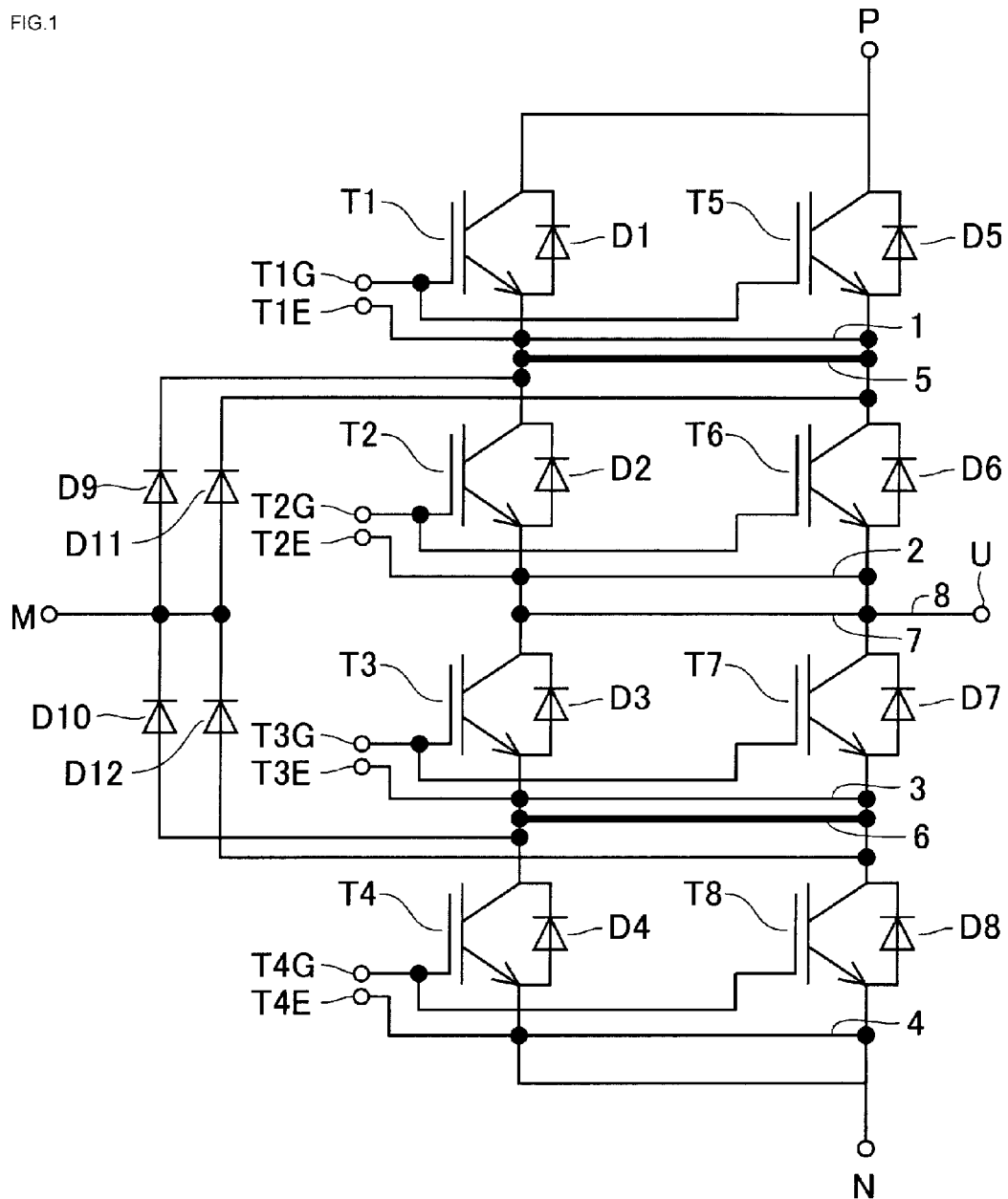
FIG. 1 is a circuit diagram of a three-level inverter circuit that is a semiconductor device according to a first embodiment of the present invention.
Figure 2:
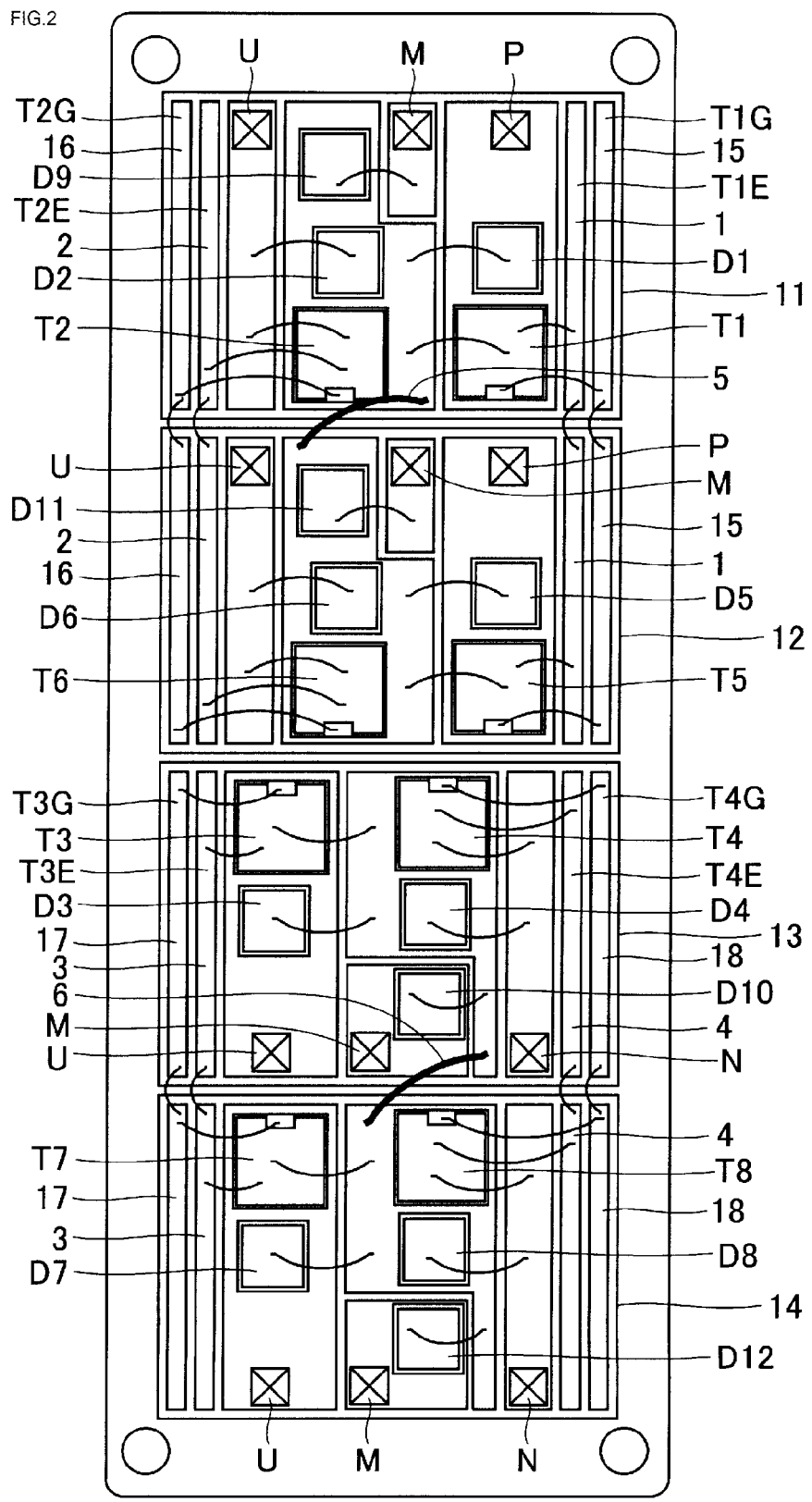
FIG. 2 is a planar view showing chip arrangement of the three-level inverter circuit that is a semiconductor device according to the first embodiment of the present invention.

FIG. 1 is a circuit diagram of a three-level inverter circuit that is a semiconductor device according to a first embodiment of the present invention; and FIG. 2 is a planar view showing chip arrangement of the three-level inverter circuit that is a semiconductor device according to the first embodiment of the present invention.

The three-level inverter circuit, as shown in FIG. 1, is composed of first and second switching circuits connected in parallel, each switching circuit composing a three-level inverter. The first switching circuit comprises four IGBT chips T1, T2, T3 and T4 connected in series between a positive potential terminal P and a negative potential terminal N of a power supply, and the IGBT chips T1, T2, T3 and T4 have respective free-wheeling diodes D1, D2, D3 and D4 connected antiparallel to the respective IGBT chips T1, T2, T3 and T4. A clamping diode D9 is connected between the node between the IGBT chips T1 and T2 and a middle potential terminal M of the power supply. A clamping diode D10 is connected between the node between the IGBT chips T3 and T4 and a middle potential terminal M of the power supply. Likewise, the second switching circuit comprises four IGBT chips T5, T6, T7 and T8 connected in series between a positive potential terminal P and a negative potential terminal N of a power supply, and the IGBT chips T5, T6, T7 and T8 have respective free-wheeling diodes D5, D6, D7 and D8 connected antiparallel to the respective IGBT chips T5, T6, T7 and T8. A clamping diode D11 is connected between the node between the IGBT chips T5 and T6 and a middle potential terminal M of the power supply. A clamping diode D12 is connected between the node between the IGBT chips T7 and T8 and a middle potential terminal M of the power supply.

In the first and second switching circuits, the couple of IGBT chips T1 and T5, the couple of IGBT chips T2 and T6, the couple of IGBT chips T3 and T7, and the couple of IGBT chips T4 and T8 operate to deliver the same level of potential and have a common terminal for applying a control signal. Each of the gate terminals of the IGBT chips T1 and T5 in the high potential side in the upper arm is connected to a common gate terminal T1G. A common auxiliary emitter terminal T1E, which gives a base potential for the gate terminal T1G, is connected to the emitter terminal of the IGBT chip T1 and further connected to the emitter terminal of the IGBT chip T5 through an auxiliary emitter line 1.

Each of the gate terminals of the IGBT chips T2 and T6 in the low potential side in the upper arm is connected to a common gate terminal T2G. A common auxiliary emitter terminal T2E is connected to the emitter terminal of the IGBT chip T2 and further connected to the emitter terminal of the IGBT chip T6 through an auxiliary emitter line 2.

Each of the gate terminals of the IGBT chips T3 and T7 in the high potential side in the lower arm is connected to a common gate terminal T3G. A common auxiliary emitter terminal T3E is connected to the emitter terminal of the IGBT chip T3 and further connected to the emitter terminal of the IGBT chip T7 through an auxiliary emitter line 3.

Each of the gate terminals of the IGBT chips T4 and T8 in the low potential side in the lower arm is connected to a common gate terminal T4G. A common auxiliary emitter terminal T4E is connected to the emitter terminal of the IGBT chip T4 and further connected to the emitter terminal of the IGBT chip T8 through an auxiliary emitter line 4.

The emitter terminal of the IGBT chip T1 in the high potential side of the upper arm is connected to the emitter terminal of the IGBT chip T5 in the high potential side of the upper arm with a wiring line 5 that has a current carrying capacity approximately equal to the rated current of the IGBT chips T1 and T5 and has a resistance value lower than the auxiliary emitter line 1. Likewise, the emitter terminal of the IGBT chip T3 in the high potential side of the lower arm is connected to the emitter terminal of the IGBT chip T7 in the high potential side of the lower arm with a wiring line 6 that has a current carrying capacity approximately equal to the rated current of the IGBT chips T3 and T7 and has a resistance value lower than the auxiliary emitter line 3. The node between the IGBT chips T2 and T3 is connected to the node between the IGBT chips T6 and T7 through an output line 7, and the latter node is connected through an output line 8 to an output terminal U for a U-phase, for example.

The IGBT chips T1 through T8, the free-wheeling diodes D1 through D8, and clamping diodes D9 through D12 are accommodated in one package and compose a three-level inverter circuit module.

In this module, the upper arm of the first switching circuit is mounted on an insulated circuit board 11. The insulated circuit board 11 has the IGBT chips T1 and T2, the free-wheeling diodes D1 and D2, and the clamping diode D9 mounted thereon. The gate terminals T1G and T2G of the IGBT chip T1 and T2 are connected to the gate line 15 and 16 respectively, and the auxiliary emitter terminals T1E and T2E are connected to the auxiliary emitter lines 1 and 2 respectively.

The upper arm of the second switching circuit is mounted on an insulated circuit board 12. The insulated circuit board 12 has the IGBT chips T5 and T6, the free-wheeling diodes D5 and D6, and the clamping diode D11 mounted thereon. The gate terminals are connected to the gate line 15 and 16, and the auxiliary emitter terminals are connected to the auxiliary emitter lines 1 and 2. The parts of the gate line 15 on the insulated circuit boards 11 and 12 are connected together with a bonding wire that composes a part of the gate line 15. The parts of the gate line 16 on the insulated circuit boards 11 and 12 are connected together with a bonding wire that composes a part of the gate line 16. The parts of the auxiliary emitter line 1 on the insulated circuit boards 11 and 12 are connected together with a bonding wire that composes a part of the auxiliary emitter line 1; and the parts of the auxiliary emitter line 2 on the insulated circuit boards 11 and 12 are connected together with a bonding wire that composes a part of the auxiliary emitter line 2.

The circuit pattern to which the emitter terminal of the IGBT chip T1 is connected with a bonding wire is connected to the circuit pattern to which the emitter terminal of the IGBT chip T5 is connected with a bonding wire, through a bonding wire corresponding to the wiring line 5 indicated in FIG. 1. This bonding wire has a current carrying capacity approximately equal to the rated current of the IGBT chips T1 and T5 and has a resistance value lower than the auxiliary emitter line 1. Thus, although this bonding wire is depicted in FIG. 2 as only one wire, the bonding wire is actually composed of a necessary number of parallel wires. Thus, even though imbalance occurs in switching operations among the IGBT chips T1, T2, T5 and T6 in the upper arm, the imbalance does not cause current flow through the auxiliary emitter line 1, and the current flows through the bonding wire corresponding to the wiring line 5. Thus, no potential difference develops in the auxiliary emitter line 1, and the IGBT chips T1 and T5 are driven under an approximately equal condition. Therefore, the power loss in the IGBT chip T5 is not larger than that in the IGBT chip T1.

The lower arm of the first switching circuit is mounted on an insulated circuit board 13. The insulated circuit board 13 has the IGBT chips T3 and T4, the free-wheeling diodes D3 and D4, and the clamping diode D10 mounted thereon. The gate terminals T3G and T4G of the IGBT chips T3 and T4 are connected to the gate line 17 and 18 respectively, and the auxiliary emitter terminals T3E and T4E are connected to the auxiliary emitter lines 3 and 4 respectively.

The lower arm of the second switching circuit is mounted on an insulated circuit board 14. The insulated circuit board 14 has the IGBT chips T7 and T8, the free-wheeling diodes D7 and D8, and the clamping diode D12 mounted thereon. The gate terminals of the IGBT chips T7 and T8 are connected to the gate line 17 and 18 respectively, and the auxiliary emitter terminals are connected to the auxiliary emitter lines 3 and 4 respectively. The parts of the gate line 17 on the insulated circuit boards 13 and 14 are connected together with a bonding wire that composes a part of the gate line 17. The parts of the gate line 18 on the insulated circuit boards 13 and 14 are connected together with a bonding wire that composes a part of the gate line 18. The parts of the auxiliary emitter line 3 on the insulated circuit boards 13 and 14 are connected together with a bonding wire that composes a part of the auxiliary emitter line 3; and the parts of the auxiliary emitter line 4 on the insulated circuit boards 13 and 14 are connected together with a bonding wire that composes a part of the auxiliary emitter line 4.

The circuit pattern to which the emitter terminal of the IGBT chip T3 is connected with a bonding wire is connected to the circuit pattern to which the emitter terminal of the IGBT chip T7 is connected with a bonding wire, with a bonding wire corresponding to the wiring line 6 indicated in FIG. 1. This bonding wire has a current carrying capacity approximately equal to the rated current of the IGBT chips T3 and T7 and has a resistance value lower than that of the auxiliary emitter line 3. Thus, although this bonding wire as depicted in FIG. 2 is composed of only one wire, the bonding wire is actually composed of a necessary number of parallel wires. Thus, even though imbalance occurs in switching operations among the IGBT chips T3, T4, T7 and T8 in the lower arm, the imbalance does not cause current flow through the auxiliary emitter line 3, and the current flows through the bonding wire corresponding to the wiring line 6. Thus, no potential difference develops in the auxiliary emitter line 3, and the IGBT chips T3 and T7 are driven under an approximately equal condition. Therefore, the power loss is reduced in total.

The output lines 7 and 8 connecting to the output terminal U, which are indicated in FIG. 1, are composed of bus bars disposed outside this module, and thus not depicted in FIG. 2.

The wiring line 5 and the wiring line 6 are provided in order to reduce the potential difference across the auxiliary emitter line 1 for the IGBT chips T1 and T5 and the potential difference across the auxiliary emitter line 3 for the IGBT chip T3 and T7 down to such a degree that does not affect gate driving operation. The wiring lines 5 and 6 reduce the resistance value between the emitter terminals of the IGBT chips. Each of the resistance values of the wiring lines 5 and 6 is preferably at most 0.1 ohm. The reason for this resistance value is as follows. The rated current of IGBTs that can be manufactured in a single chip at present is in the range of about 100 to 150 amps in consideration of manufacturing process and costs; inverter circuits for larger current capacity are constructed by a plurality of chips connected in parallel. If the gate voltage, which is about 15 volts, for driving an IGBT is different by as large as 1 volt between the parallel-connected IGBTs, parallel operation of the IGBTs cannot be performed. Supposing a current of 100 amps, for example, flows in parallel-connected IGBTs, a current flowing between the emitter terminals of the parallel-connected IGBTs can amount to as large as 10 amps. In that situation, the potential difference between the emitter terminals has to be not higher than 1 volt, which leads to the resistance value of the wiring line 5 and the wiring line 6 to be not larger than 0.1 ohm. The resistance values of the wiring lines 5 and 6 are actually made to be in the order of 0.001 ohm, which is sufficiently smaller than the resistance value of the auxiliary emitter lines 1 and 3. Thus, the potential difference between the emitter terminals of the IGBTs is such a small value that does not affect gate driving operation. Therefore, the parallel-connected IGBTs allow stable gate driving operation and reduced switching loss.

Figure 3:
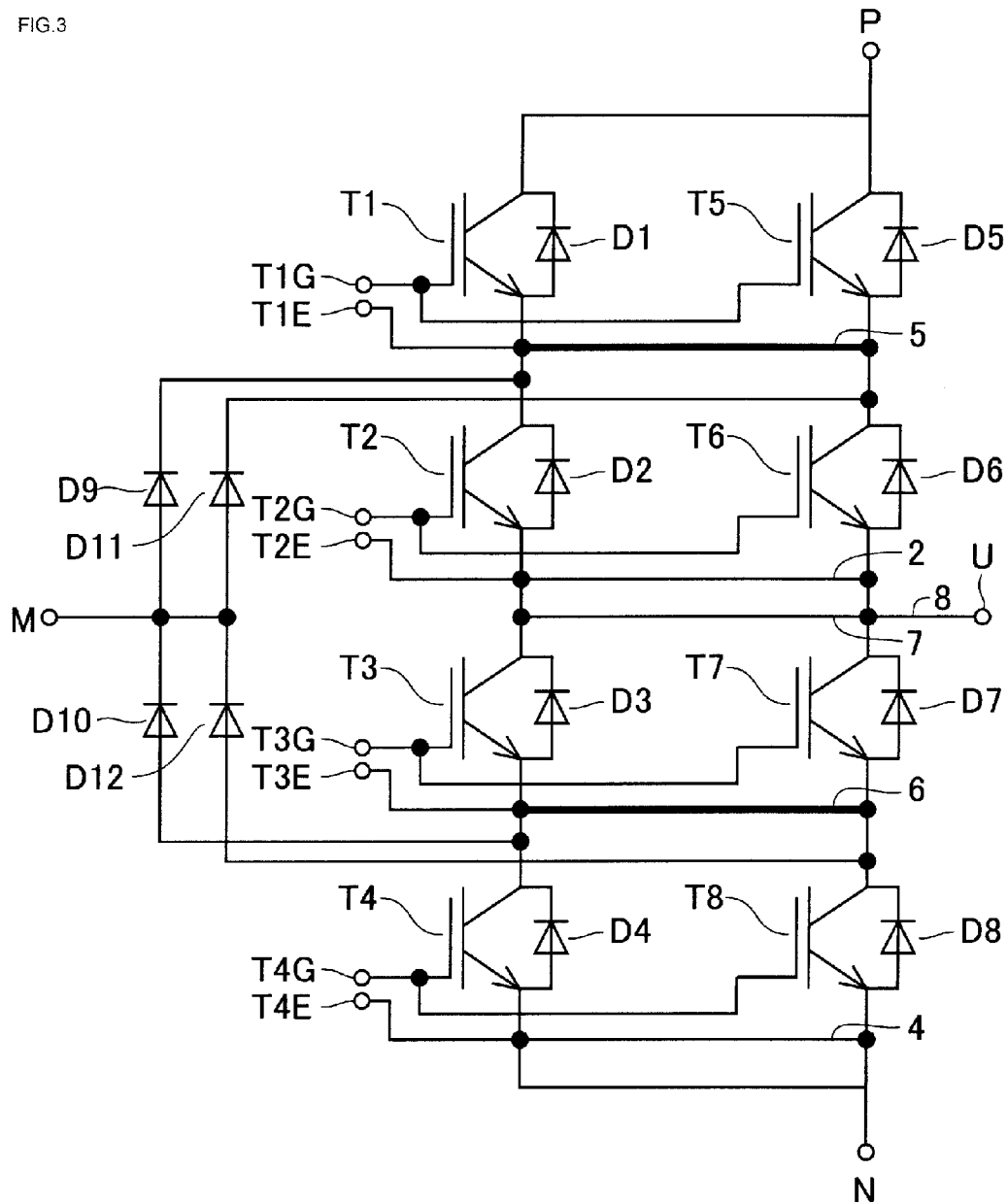
FIG. 3 is a circuit diagram of a three-level inverter circuit that is a semiconductor device according to a second embodiment of the present invention.
Figure 4:
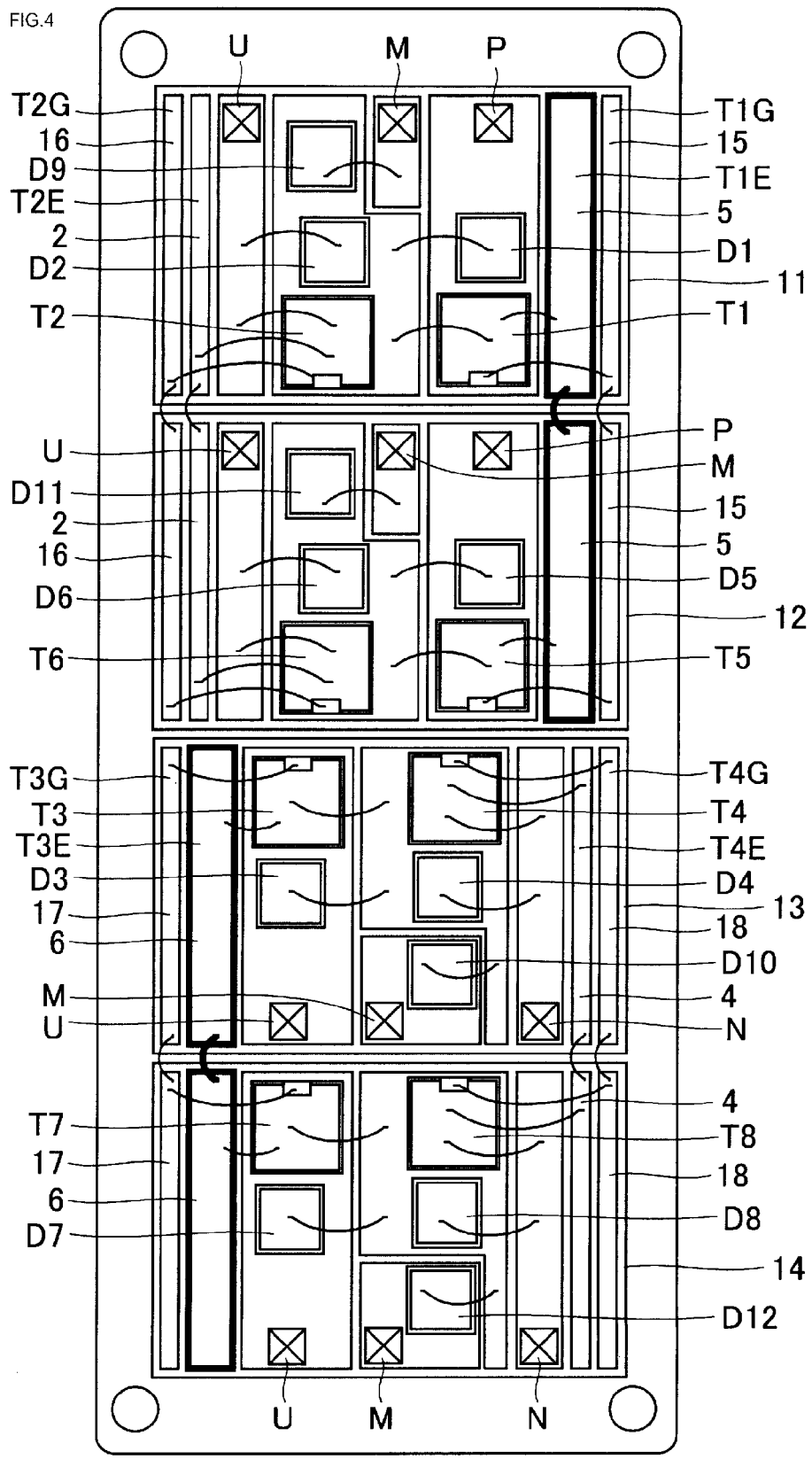
FIG. 4 is a planar view showing chip arrangement of the three-level inverter circuit that is a semiconductor device according to the second embodiment of the present invention.

FIG. 3 is a circuit diagram of a three-level inverter circuit that is a semiconductor device according to a second embodiment of the present invention; and FIG. 4 is a planar view showing chip arrangement of the three-level inverter circuit that is a semiconductor device according to the second embodiment of the present invention. The components in FIG. 3 and FIG. 4 similar to those in FIG. 1 and FIG. 2 are given the same symbols.

The three-level inverter circuit of the semiconductor device according to the second embodiment is different from the three-level inverter circuit of the semiconductor device according to the first embodiment in that the wiring line 5 provided between the emitter terminals of the IGBT chips T1 and T5 and the wiring line 6 provided between the emitter terminals of the IGBT chips T3 and T7 are changed in configuration and position as shown in FIG. 3 and FIG. 4. In the three-level inverter circuit of the semiconductor device according to the second embodiment as shown in FIG. 3, the auxiliary emitter lines 1 and 3 in the circuit of FIG. 1 are replaced by wiring lines 5 and 6 having a larger current carrying capacity and a lower resistance value than those of the auxiliary emitter lines 1 and 3.

In the module shown in FIG. 4, the wiring line 5 is constructed by a circuit pattern, to which the auxiliary emitter terminal T1E is connected, with a shape of strips on the insulated circuit boards 11 and 12 and a bonding wire connecting the strips. Likewise, the wiring line 6 is constructed by a circuit pattern, to which the auxiliary emitter terminal T3E is connected, with a shape of strips on the insulated circuit boards 13 and 14 and a bonding wire connecting the strips.

In this three-level inverter circuit, too, even though differences in characteristics exist among the IGBT chips T1, T2, T5, and T6 in the upper arm, and among the IGBT chips T3, T4, T7, and T8 in the lower arm, the current in the switching operation due to the imbalance flows through the wiring line 5 and the wiring line 6. This current through the wiring lines 5 and 6 does not generate a large voltage drop. Thus, the gate voltages of the IGBT chips T5 and T7 are stable and switching losses in the IGBT chips T5 and T7 are reduced.

Figure 5:
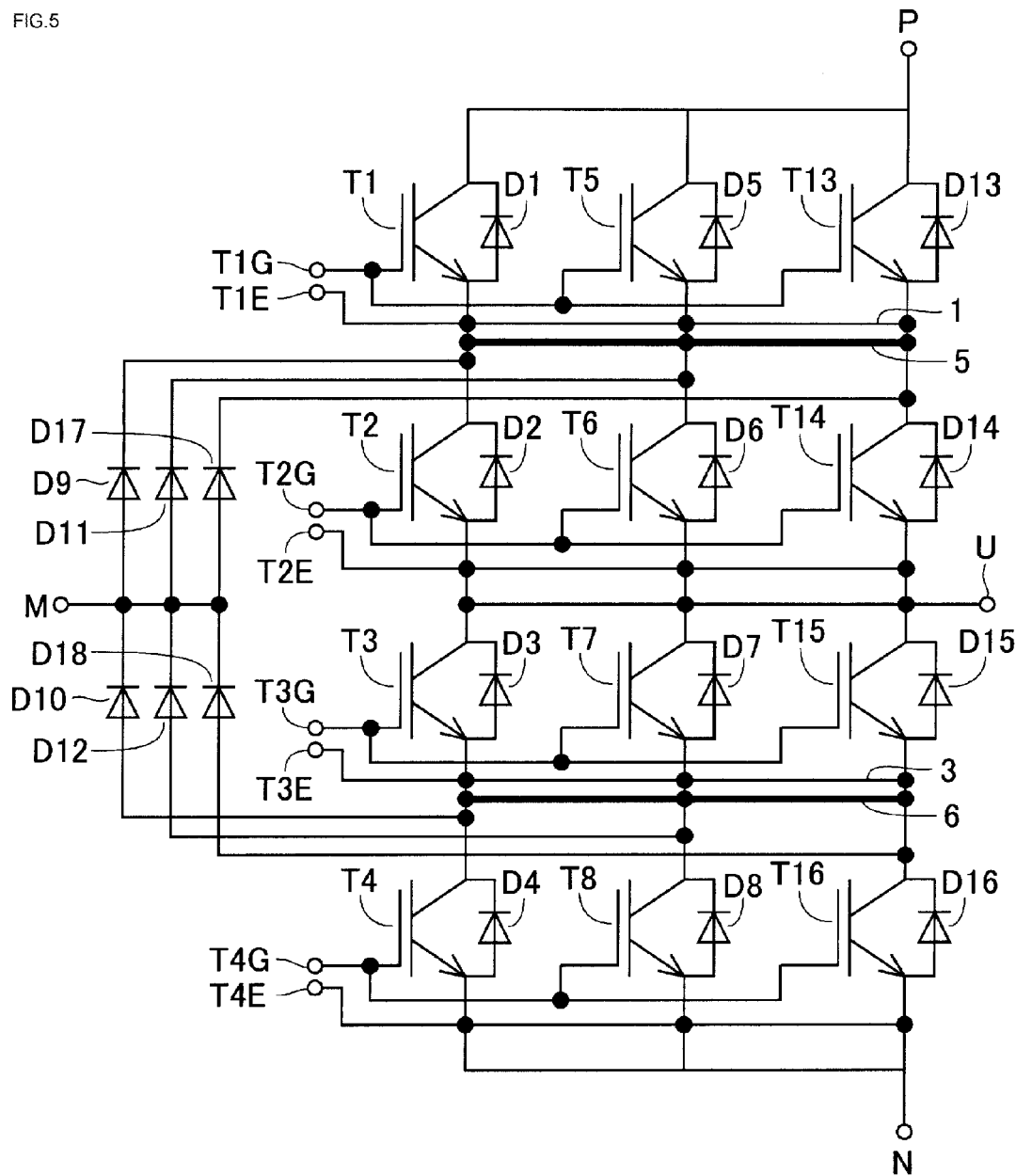
FIG. 5 is a circuit diagram of a three-level inverter circuit that is a semiconductor device according to a third embodiment of the present invention.

FIG. 5 is a circuit diagram of a three-level inverter circuit that is a semiconductor device according to a third embodiment of the present invention. The components in FIG. 5 similar to those in FIG. 1 are given the same symbols.

This three-level inverter circuit that is a semiconductor device according to a third embodiment of the present invention is different from the three-level inverter circuit that is a semiconductor device according to the first embodiment in that the three-level inverter circuit of the third embodiment comprises three parallel-connected switching circuits while the three-level inverter circuit of the first embodiment comprises two parallel-connected switching circuits.

This three-level inverter circuit is composed of first, second and third switching circuits, each being a three-level inverter. The first switching circuit comprises four IGBT chips T1, T2, T3 and T4 connected in series; four free-wheeling diodes D1, D2, D3 and D4; and two clamping diodes D9 and D10. The second switching circuit comprises four IGBT chips T5, T6, T7 and T8 connected in series; four free-wheeling diodes D5, D6, D7 and D8; and two clamping diodes D11 and D12. The third switching circuit comprises four IGBT chips T13, T14, T15 and T16 connected in series; four free-wheeling diodes D13, D14, D15 and D16; and two clamping diodes D17 and D18.

In the three-level inverter circuit composed of the first, second and third switching circuits, too, the emitter terminals of the IGBT chips T1, T5, and T13 are connected with an auxiliary emitter line 1. In addition, a wiring line 5 is connected in parallel to the auxiliary emitter line 1, to increase current capacity and reduce resistance value from those of the auxiliary emitter line 1. Likewise, the emitter terminals of the IGBT chips T3, T7, and T15 are connected with an auxiliary emitter line 3. In addition, a wiring line 6 is connected in parallel to the auxiliary emitter line 3, to increase current capacity and reduce resistance value from those of the auxiliary emitter line 3.

Although the semiconductor device according to the third embodiment is composed of three switching circuits connected in parallel, four or more switching circuits can be provided for composing a semiconductor device. In that case, too, wiring lines 5 and 6 are connected in parallel to auxiliary emitter lines 1 and 3. Alternatively the auxiliary emitter lines 1 and 3 can be replaced by the wiring lines 5 and 6, similarly to the semiconductor device of the second embodiment.

Figure 6:
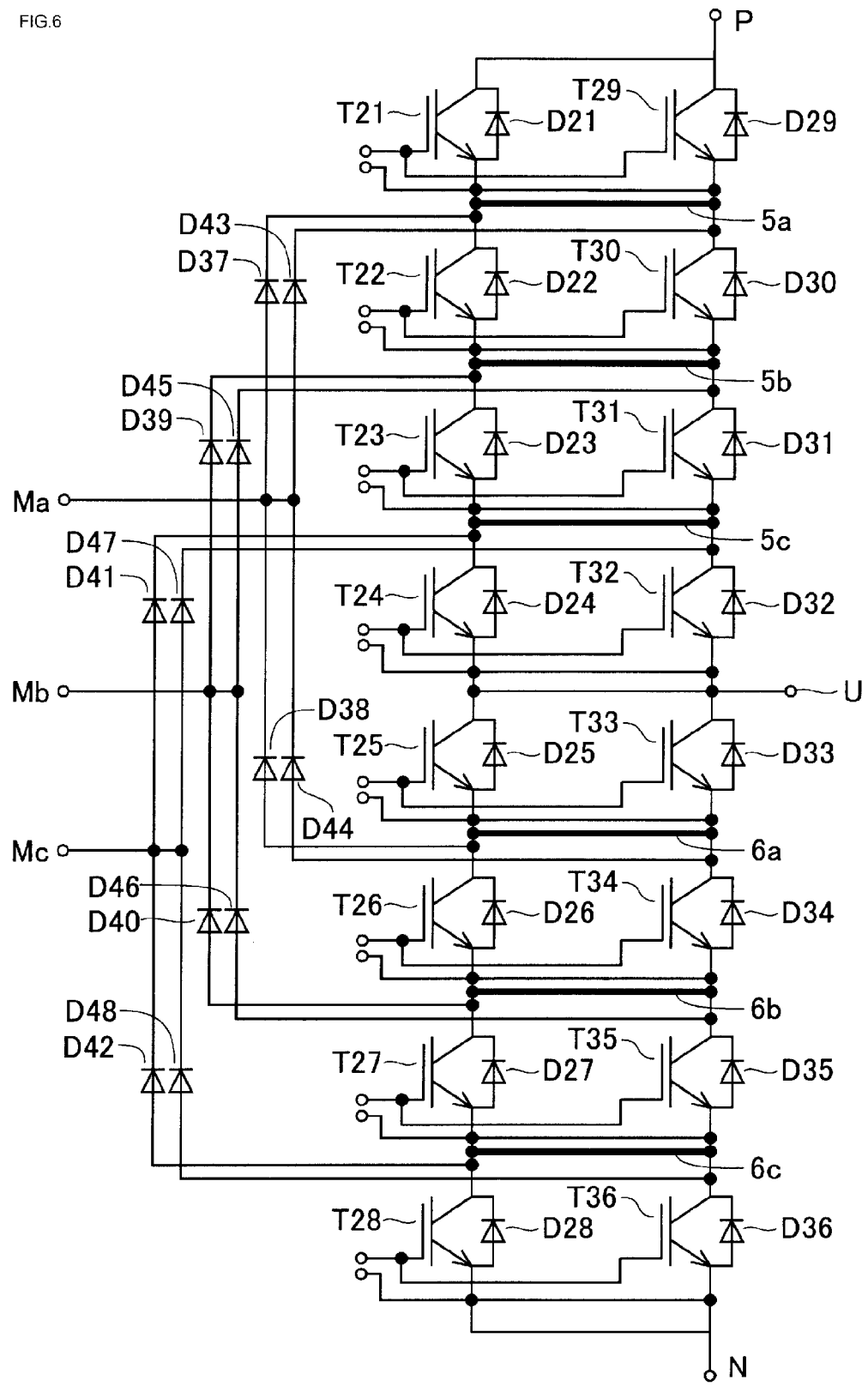
FIG. 6 is a circuit diagram of a five-level inverter circuit that is a semiconductor device according to a fourth embodiment of the present invention.
Figure 7:
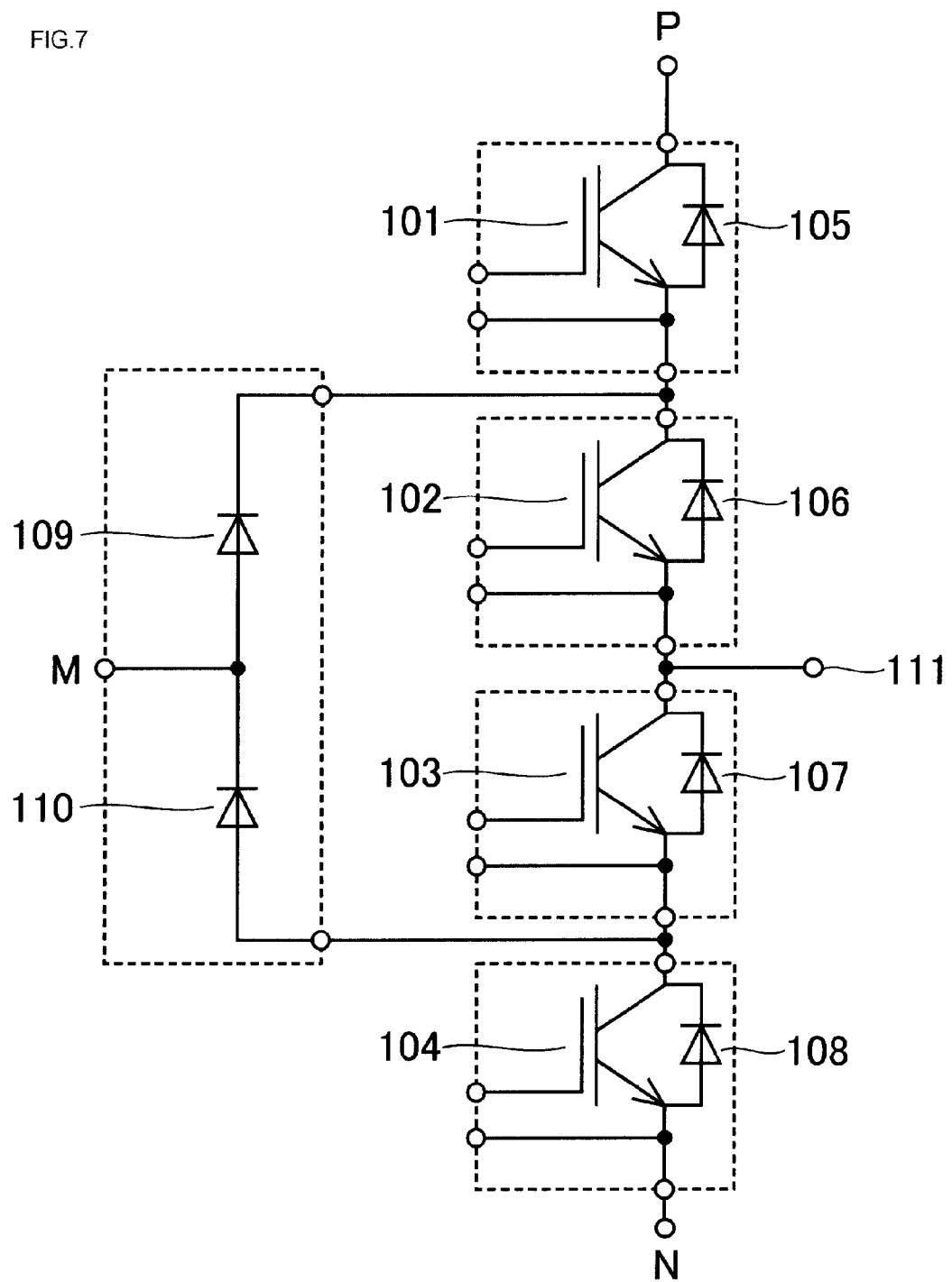
FIG. 7 is a circuit diagram of a one phase, three-level inverter circuit of a general construction using switching elements of IGBTs.
Figure 8:
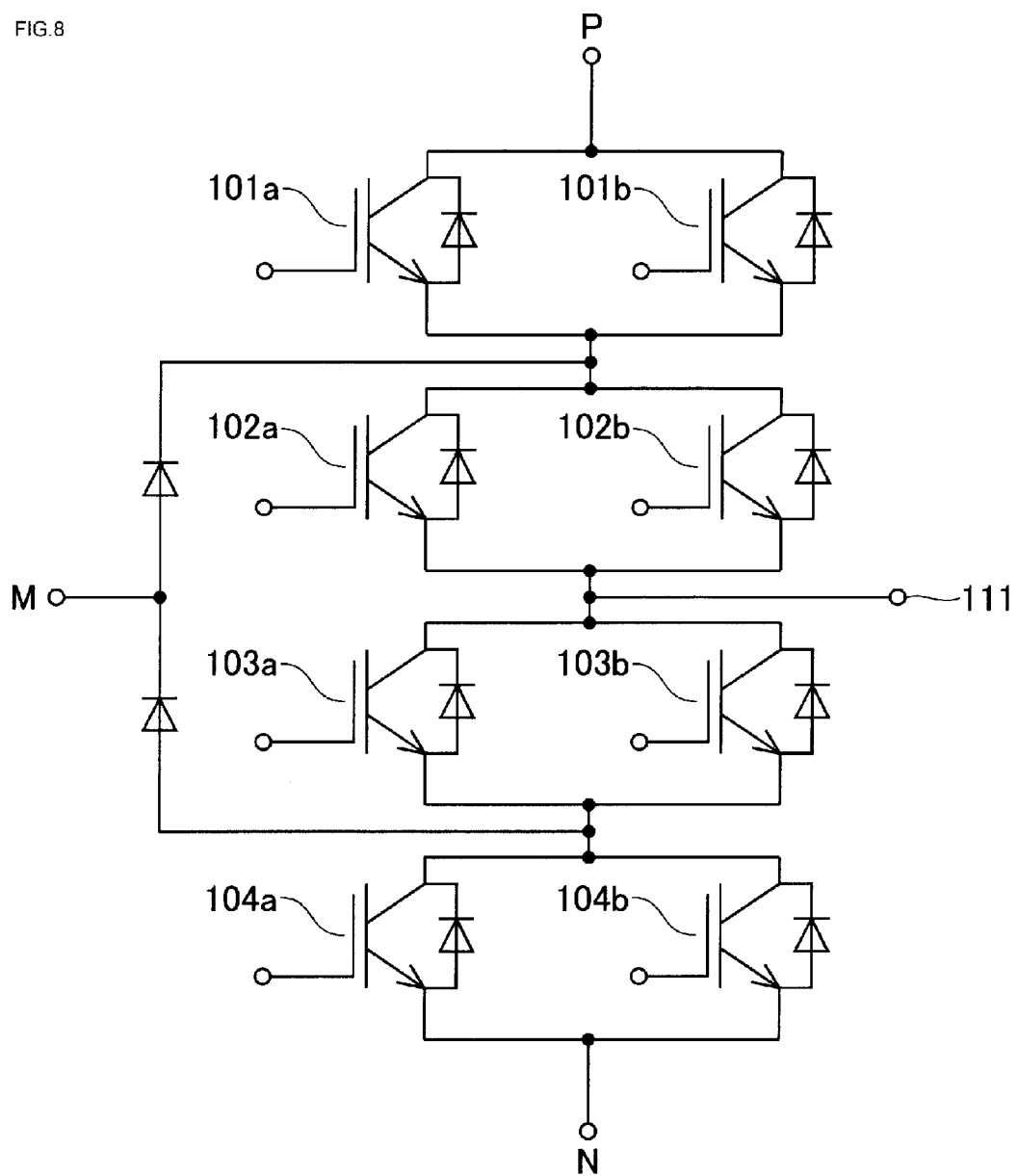
FIG. 8 is a circuit diagram of a first example of a three-level inverter circuit with increased current capacity.
Figure 9:
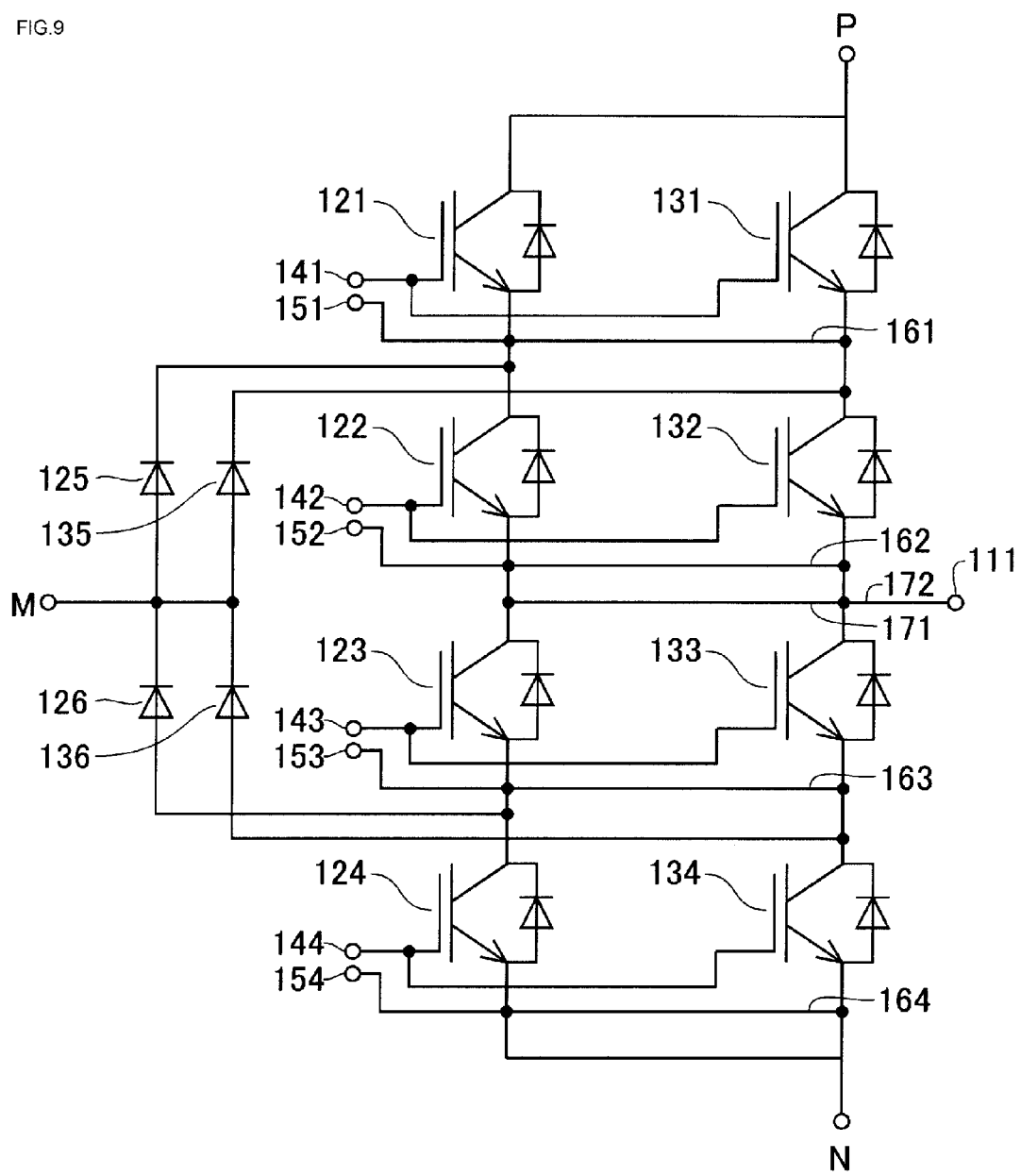
FIG. 9 is a circuit diagram of a second example of a three-level inverter circuit with increased current capacity.

FIG. 6 is a circuit diagram of a five-level inverter circuit that is a semiconductor device according to a fourth embodiment of the present invention. The components in FIG. 6 similar to those in FIG. 1 are given the same symbols.

This five-level inverter circuit that is a semiconductor device according to a fourth embodiment is composed of first and second switching circuits connected in parallel, each switching circuit being a five-level inverter. The first switching circuit comprises: eight IGBT chips T21 through T28 connected in series; eight free-wheeling diodes D21 through 28; and six clamping diodes D37 through D42. The second switching circuit comprises: eight IGBT chips T29 through T36 connected in series; eight free-wheeling diodes D29 through D36; and six clamping diodes D43 through D48.

The node between the clamping diodes D37 and D38 and the node between the clamping diodes D43 and D44 are connected to a middle potential terminal Ma. The node between the clamping diodes D39 and D40 and the node between the clamping diodes D45 and D46 are connected to a middle potential terminal Mb. The node between the clamping diodes D41 and D42 and the node between the clamping diodes D47 and D48 are connected to a middle potential terminal Mc. The output terminal U is connected to the node between the IGBT chips T24 and T25, and to the node between the IGBT chips T32 and T33.

In this five-level inverter circuit, wiring lines 5a, 5b and 5c connect the emitter terminals of the IGBT chips T21 and T29, the emitter terminals of the IGBT chips T22 and T30, and the emitter terminals of the IGBT chips T23 and T31, respectively. Wiring lines 6a, 6b, and 6c connect the emitter terminals of the IGBT chips T25 and T33, the emitter terminals of the IGBT chips T26 and T34, and the emitter terminals of the IGBT chips T27 and T35, respectively.

This five-level inverter circuit comprises the wiring lines 5a, 5b, 5c, 6a, 6b and 6c that connect each of the pairs of series-connection nodes to which the clamping diodes D37 through D48 are connected. Thus, current carrying capacity is increased and the resistance value is reduced from those of the auxiliary emitter lines.

Although the semiconductor device of the fourth embodiment has a construction of five-level inverter circuit, a semiconductor device can have a construction of seven-level or higher level inverter. In that construction, wiring lines corresponding to the wiring lines 5a, 5b, 5c, 6a, 6b and 6c are provided. Alternatively, the auxiliary emitter lines in the semiconductor device of the fourth embodiment can be eliminated leaving the wiring lines 5a, 5b, 5c, 6a, 6b and 6c, similarly to the second embodiment.

The switching elements, which are IGBTs in the embodiments described thus far, can be changed to MOSFETs (metal-oxide-semiconductor field effect transistors), SiC (silicon carbide) MOSFETs, or SiC IGBTs.

REFERENCE SIGNS AND NUMERALS ARE AS FOLLOWS 1, 2, 3, 4: auxiliary emitter line
5, 5a, 5b, 5c, 6, 6a, 6b, 6c: wiring line
7, 8: output line
11, 12, 13, 14: insulated circuit board
15, 16, 17, 18: gate line
D1, D2, D3, D4, D5, D6, D7, D8; D13, D14, D15, D16; D21, D22, D23, D24, D25, D26, D27, D28, D29, D30, D31, D32, D33, D34, D35, D36: free-wheeling diode
D9, D10, D11, D12; D17, D18; D37, D38, D39, D40, D41, D42, D43, D44, D45, D46, D47, D48: clamping diode
M, Ma, Mb, Mc: middle potential terminal
N: negative potential terminal
P: positive potential terminal
T1, T2, T3, T4, T5, T6, T7, T8; T13, T14, T15, T16; T21, T22, T23, T24, T25, T26, T27, T28, T29, T30, T31, T32, T33, T34, T35, T36: IGBT chip
T1E, T2E, T3E, T4E: auxiliary emitter terminal
T1G, T2G, T3G, T4G: gate terminal
U: output terminal Although a few embodiments have been shown and described, it would be appreciated by those skilled in the art that changes may be made in these embodiments without departing from the principles and spirit of the invention, the scope of which is defined in the claims and their equivalents.

What is claimed is:

1. A semiconductor device comprising:
   at least two switching circuits connected in parallel, each of the at least two switching circuits comprising at least two switching elements connected in series and a clamping diode connected to a node between adjacent switching elements of the least two switching elements;
   a base potential line, connecting auxiliary terminals of different switching circuits of the at least two switching circuits at a base potential to apply an equivalent control signal on the switching elements, that operates to deliver an equal level of potential in the parallel-connected switching circuits; and
   a wiring line connecting the respective nodes of the different switching circuits, having a current carrying capacity approximately equal to a rated current of at least one of the switching elements connected to the wiring line, and having a lower resistance value than that of the base potential line.

2. The semiconductor device according to claim 1, wherein the at least two switching circuits are mounted on circuit patterns formed on individual insulated circuit boards, and the wiring line connects the circuit patterns forming the nodes on the adjacent insulated circuit boards.

3. The semiconductor device according to claim 1, wherein the at least one of the switching elements connected to the wiring line is an IGBT chip and the wiring line connects emitter terminals of the IGBT chips at a high potential side of series-connected IGBT chips.

4. The semiconductor device according to claim 1, wherein the wiring line has a resistance value not larger than 0.1 ohm.

5. The semiconductor device according to claim 1, wherein
   the at least two switching circuits comprises
      a first switching circuit comprising a first IGBT and a second IGBT connected in series with each other, the first IGBT and the second IGBT each antiparallel-connected to a respective diode, and a second switching circuit connected in parallel to the first switching circuit and comprising a third IGBT and a fourth IGBT connected in series with each other, the third IGBT and the fourth IGBT each antiparallel-connected to a respective diode, the base potential line connects between an emitter of the first IGBT and an emitter of the third IGBT, and the wiring line connects between an emitter of the first IGBT and an emitter of the third IGBT and has a current carrying capacity approximately equal to a rated current of the first IGBT and the third IGBT.

6. The semiconductor device according to claim 1, further comprising:
   a common gate terminal connected to respective gate terminals of the different switching circuits and to a gate terminal of a second of the different switching circuits; and
   a common auxiliary emitter terminal to apply the base potential for the common gate terminal,
   wherein the common auxiliary emitter terminal is connected to the base potential line.

7. The semiconductor device according to claim 1, wherein the semiconductor device is a one-phase inverter circuit.

8. A semiconductor device comprising:
   at least two switching circuits connected in parallel, each of the at least two switching circuit comprising at least two IGBT chips connected in series and a clamping diode connected to a node between adjacent IGBT chips of the at least two IGBT chips; and
   an auxiliary emitter line that connects auxiliary emitter terminals of the IGBT chips of different switching circuits of the at least two switching circuits at a high potential side of the series-connected IGBT chips in the parallel-connected switching circuits, and that has a current carrying capacity approximately equal to a rated current of at least one of the IGBT chips connected to the auxiliary emitter line.

9. The semiconductor device according to claim 8, wherein the auxiliary emitter line has a resistance value not larger than 0.1 ohm.

10. The semiconductor device according to claim 8, wherein the semiconductor device is a one-phase inverter circuit.

11. The semiconductor device according to claim 8, wherein the at least two switching circuits are mounted on circuit patterns formed on individual insulated circuit boards, and the auxiliary emitter line connects the circuit patterns forming the nodes on the adjacent insulated circuit boards.

12. A semiconductor device comprising:
    at least two switching circuits connected in parallel, each of the at least two switching circuit comprising at least two IGBT chips connected in series and a clamping diode connected to a node between adjacent IGBT chips of the at least two IGBT chips;
    a base potential line, connecting auxiliary emitter terminals of the IGBT chips of different switching circuits of the at least two switching circuits, that operates to deliver an equal level of potential in the parallel-connected switching circuits; and
    a wiring line connecting the respective nodes of the different switching circuits, having a current carrying capacity approximately equal to a rated current of the at least one of the IGBT chips connected to the wiring line, and having a lower resistance value than that of the base potential line.

13. The semiconductor device according to claim 12, further comprising:
    a common gate terminal connected to respective gates of the IGBT chips of the different switching circuits; and
    a common auxiliary emitter terminal to apply the base potential for the common gate terminal,
    wherein the common auxiliary emitter terminal is connected to the base potential line.

14. The semiconductor device according to claim 12, further comprising:
    a common gate terminal connected to respective gates of the IGBT chips of the different switching circuits; and
    a common auxiliary emitter terminal to apply the base potential for the common gate terminal,
    wherein the auxiliary emitter line connects the auxiliary emitter terminals of the IGBT chips of the different switching circuits to the common auxiliary emitter terminal.

15. The semiconductor device according to claim 12, wherein the wiring line has a resistance value not larger than 0.1 ohm.

16. The semiconductor device according to claim 12, wherein the semiconductor device is a one-phase inverter circuit.

17. The semiconductor device according to claim 12, wherein the at least two IGBT chips are mounted on circuit patterns formed on individual insulated circuit boards, and the wiring line connects the circuit patterns forming the nodes on the adjacent insulated circuit boards.

* * * * *